(12) United States Patent
Sharma et al.

(10) Patent No.: US 12,294,364 B2
(45) Date of Patent: May 6, 2025

(54) TRANSISTOR WITH INTEGRATED TURN-OFF SLEW RATE CONTROL

(71) Applicant: GlobalFoundries U.S. Inc., Malta, NY (US)

(72) Inventors: Santosh Sharma, Austin, TX (US); Mei Yu Soh, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 49 days.

(21) Appl. No.: 18/455,669

(22) Filed: Aug. 25, 2023

(65) Prior Publication Data

US 2025/0070781 A1 Feb. 27, 2025

(51) Int. Cl.
*H03K 19/003* (2006.01)
*H03K 17/0412* (2006.01)
*H03K 17/06* (2006.01)

(52) U.S. Cl.
CPC . *H03K 19/00384* (2013.01); *H03K 17/04123* (2013.01); *H03K 2017/066* (2013.01); *H03K 2217/0036* (2013.01)

(58) Field of Classification Search
CPC ....... H03K 19/00384; H03K 17/04123; H03K 2017/066; H03K 2217/0036; H03K 19/01; H03K 19/017; H03K 19/01707; H03K 19/01742; H03K 17/0416; H03K 17/04163; H03K 17/042; H03K 17/04206; H03K 17/08; H03K 17/081; H03K 17/08104; H03K 17/0812; H03K 17/08122; H03K 17/0814; H03K 17/08142; H03K 17/082;

(Continued)

(56) References Cited

U.S. PATENT DOCUMENTS 6,075,414 A 6/2000 Nagaoka et al.
9,692,408 B2 6/2017 Roberts et al.
(Continued)

FOREIGN PATENT DOCUMENTS

TW 202213700 A 4/2022
WO 2017176287 A1 10/2017

OTHER PUBLICATIONS

U.S. Appl. No. 18/045,909, Response to Final Office Action filed Jul. 29, 2024, 9 pages.

(Continued)

*Primary Examiner* — Jung Kim
(74) *Attorney, Agent, or Firm* — David Cain; Hoffman Warnick LLC

(57) ABSTRACT

A circuit structure includes an enhancement mode transistor and a turn-off slew rate controller for automatically adding drain-source capacitance to the transistor when the transistor is transitioning to an off state. The added drain-source capacitance slows the turn-off slew rate (dV/dt_off) of the transistor without also increasing the turn-off energy loss (E_off). The slew rate controller can include: sensors connected to the drain region for sensing both the drain voltage and the slew rate, respectively; a logic circuit for generating and outputting an enable signal based on output voltages from the sensors; and a capacitance adder for adding to the drain-source capacitance only when the logic value of the enable signal indicates that the drain voltage is at or above a predetermined positive drain voltage level and the slew rate is positive.

20 Claims, 4 Drawing Sheets

(58) Field of Classification Search
CPC .. H03K 17/0822; H03K 17/16; H03K 17/161; H03K 17/162; H03K 17/165; H03K 17/166; H03K 17/302
See application file for complete search history.

(56) References Cited

U.S. PATENT DOCUMENTS

| | | | |
|---|---|---|---|
| 9,929,652 | B1 | 3/2018 | Ribarich et al. |
| 10,749,514 | B2 | 8/2020 | Lee et al. |
| 2002/0153938 | A1 | 10/2002 | Baudelot et al. |
| 2003/0151865 | A1 | 8/2003 | Maio |
| 2011/0193619 | A1 | 8/2011 | Parikh et al. |
| 2012/0039427 | A1* | 2/2012 | Wu .......... H03K 17/166 375/371 |
| 2013/0182357 | A1 | 7/2013 | Brodsky |
| 2014/0062585 | A1 | 3/2014 | Weis |
| 2020/0227546 | A1 | 7/2020 | Huang et al. |
| 2022/0270544 | A1 | 8/2022 | Park et al. |

OTHER PUBLICATIONS

U.S. Appl. No. 18/045,909, Notice of Allowance dated Aug. 12, 2024, 8 pages.
Sun et al., "Active dv/dt control of 600V GaN transistors," published In 2016 IEEE Energy Conversion Congress and Exposition (ECCE), downloaded from IEEE Xplore on Jun. 16, 2022, 8 pages.
Wu et al., "Prediction of overshoot and crosstalk of low-voltage GaN HEMT using analytical model," IET Power Electronics, 2022; 15: 1295-1321.
U.S. Appl. No. 18/045,909, Response to Office Action filed Apr. 15, 2024, 15 pages.
U.S. Appl. No. 18/045,909, Office Action dated Feb. 12, 2024, 18 pages.
European Search Report for corresponding EP Application No. 23196216.8-1211 dated Apr. 26, 2024, 13 pages.
U.S. Appl. No. 18/045,909, Final Office Action dated Jul. 9, 2024, 11 pages.
European Search Report for U.S. Appl. No. 18/045,909-1211 dated Feb. 14, 2024, 14 pages (corresponding to related U.S. Appl. No. 18/045,909).

* cited by examiner

TRANSISTOR WITH INTEGRATED TURN-OFF SLEW RATE CONTROL

GOVERNMENT LICENSE RIGHTS

This invention was made with government support under Contract Number HQ0727790700 awarded by the Defense Microelectronics Activity (DMEA). The government has certain rights in the invention.

BACKGROUND

The present disclosure relates to transistors, such as high electron mobility transistors (HEMTs) and metal-insulator-semiconductor HEMTs (MISHEMTs).

III-V semiconductor devices, such as gallium nitride (GaN)-based high electron mobility transistors (HEMTs) and GaN-based metal-insulator-semiconductor (MIS) HEMTs (MISHEMTs) or other III-V semiconductor transistors, have emerged as a leading technology for radio frequency (RF) and millimeter wave (mmWave) (e.g., 3-300 GHz) wireless applications. However, such devices have extremely fast switching rates that can lead to ringing and higher order harmonics. In some devices, such as power supplies, ringing and higher order harmonics can lead to electromagnetic interference that requires expensive filtering components to minimize.

SUMMARY

Disclosed herein are embodiments of a circuit structure. The circuit structure includes a transistor and, particularly, an enhancement mode transistor. The transistor can include a source region and a drain region. The circuit structure can also include a slew rate controller, which is connected to the source region and to the drain region of the transistor. The slew rate controller increases drain-source capacitance of the transistor to slow the slew rate whenever the drain voltage at the drain region rises at least to a predetermined positive drain voltage level and the slew rate is positive.

In some embodiments, the disclosed circuit structure can include a transistor and, particularly, an enhancement mode transistor. The transistor can have a source region and a drain region. The circuit structure can also include a slew rate controller, which is connected to the source region and to the drain region of the transistor. The slew rate controller can include sensors connected to the drain region. The sensors can sense the drain voltage at the drain region and the slew rate, respectively. The slew rate controller can further include a logic circuit connected to the sensors. The logic circuit can generate and output an enable signa, which switches from a logic 0 value to a logic 1 value whenever the drain voltage is at least at a predetermined positive drain voltage level and the slew rate is positive. The slew rate controller can also include a capacitance adder, which is connected to the logic circuit, the drain region, and the source region. The capacitance adder can increase drain-source capacitance of the transistor to slow the slew rate when the enable signal has the logic 1 value.

In some embodiments, the disclosed circuit structure can include an enhancement mode transistor with a source region and a drain region. The circuit structure can also include a slew rate controller. The slew rate controller can further include a first interconnect line, which is connected to the drain region, and a second interconnect line, which is connected to the source region and to ground. The slew rate controller can also include sensors, which are connected to the first interconnect line and to the second interconnect line and which sense the drain voltage at the drain region and the slew rate, respectively. The slew rate controller can include a logic circuit, which is connected to the sensors. The logic circuit can generate and output an enable signal (EN) that switches from a logic 0 value to a logic 1 value whenever the drain voltage is at least at a predetermined positive drain voltage level and the slew rate is positive. The slew rate controller can further include a capacitance adder. The capacitance adder can include a capacitor and an additional enhancement mode transistor connected in series between the first interconnect line and the second interconnect line. The additional enhancement mode transistor can have a gate connected to receive the enable signal and can turn on when the enable signal has the logic 1 value in order to electrically connect plates of the capacitor to the drain region and the source region, respectively, and, thereby to increase drain-source capacitance of the enhancement mode transistor and slow the slew rate.

BRIEF DESCRIPTION OF THE SEVERAL VIEWS OF THE DRAWINGS

The present disclosure will be better understood from the following detailed description with reference to the drawings, which are not necessarily drawn to scale and in which.

DETAILED DESCRIPTION

As mentioned above, III-V semiconductor transistors, such as GaN-based HEMTs and MISHEMTs or other III-V semiconductor transistors, have fast switching rates. However, fast switching rates can lead to ringing and higher order harmonics. In some devices, such as power supplies, ringing and higher order harmonics can lead to electromagnetic interference that requires expensive filtering components to minimize.

In view of the foregoing, disclosed herein are embodiments of circuit structure including an enhancement mode transistor (e.g., an enhancement mode GaN-based HEMT or MISHEMT or some other enhancement mode III-V semiconductor transistor) with an integrated turn-off slew rate controller to minimize electromagnetic interference and thereby reduce the need for expensive filtering components. Specifically, in the disclosed embodiments, the circuit structure can include an enhancement mode transistor and a turn-off slew rate controller for the enhancement mode transistor. The slew rate controller can automatically add drain-source capacitance when the transistor is switching off (i.e., becoming non-conductive). The added drain-source capacitance effectively slows the turn-off slew rate (dV/dt_off) without also further increasing turn-off energy loss (E_off). For example, the slew rate controller can include: sensors connected to the drain region of the transistor for sensing the drain voltage and the slew rate; a logic circuit for generating and outputting an enable signal based on outputs from the sensors; and a capacitance adder for adding to the drain-source capacitance only when the enable signal indicates that the drain voltage is at or above a predetermined positive drain voltage level and that the slew rate is positive.

Figure 1:
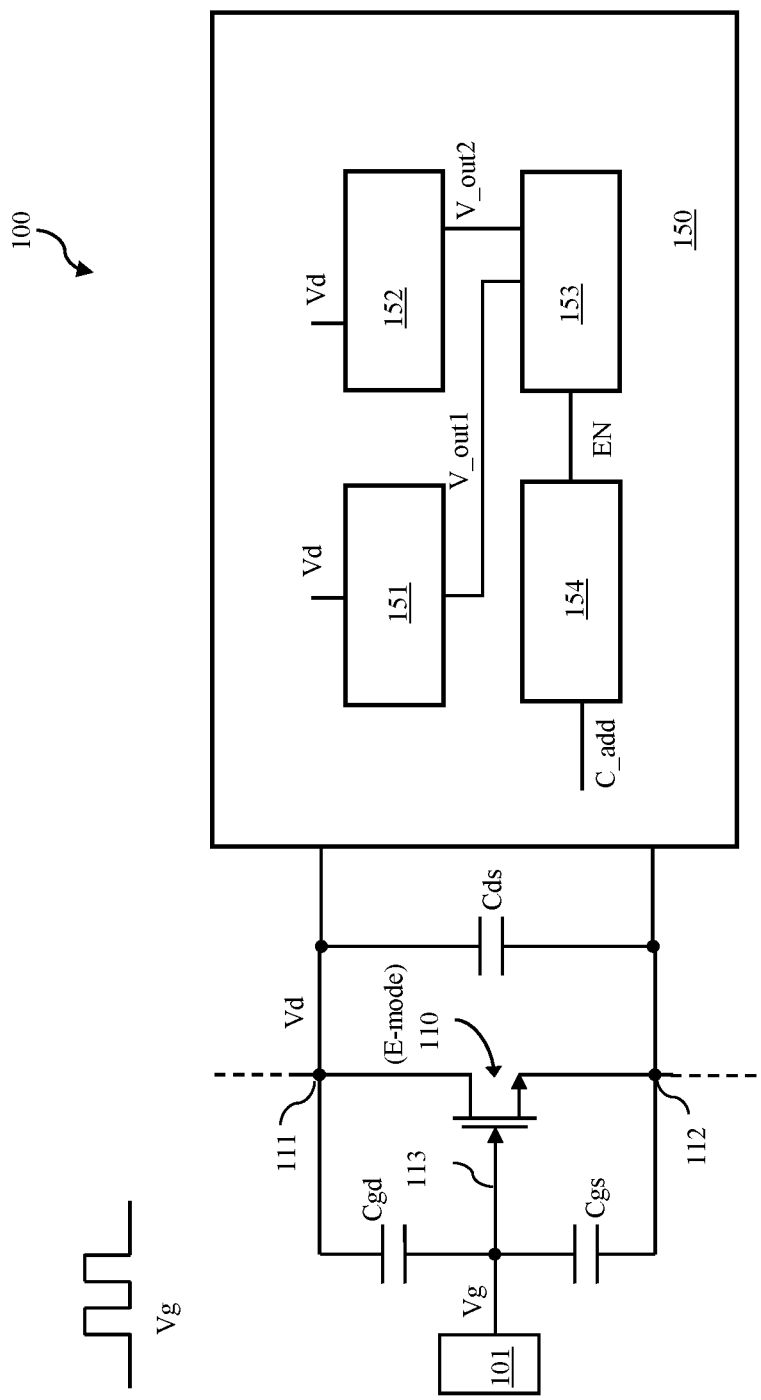
FIG. 1 is a circuit diagram illustrating disclosed circuit structure embodiments including a transistor and integrated turn-off slew rate controller.
Figure 2:
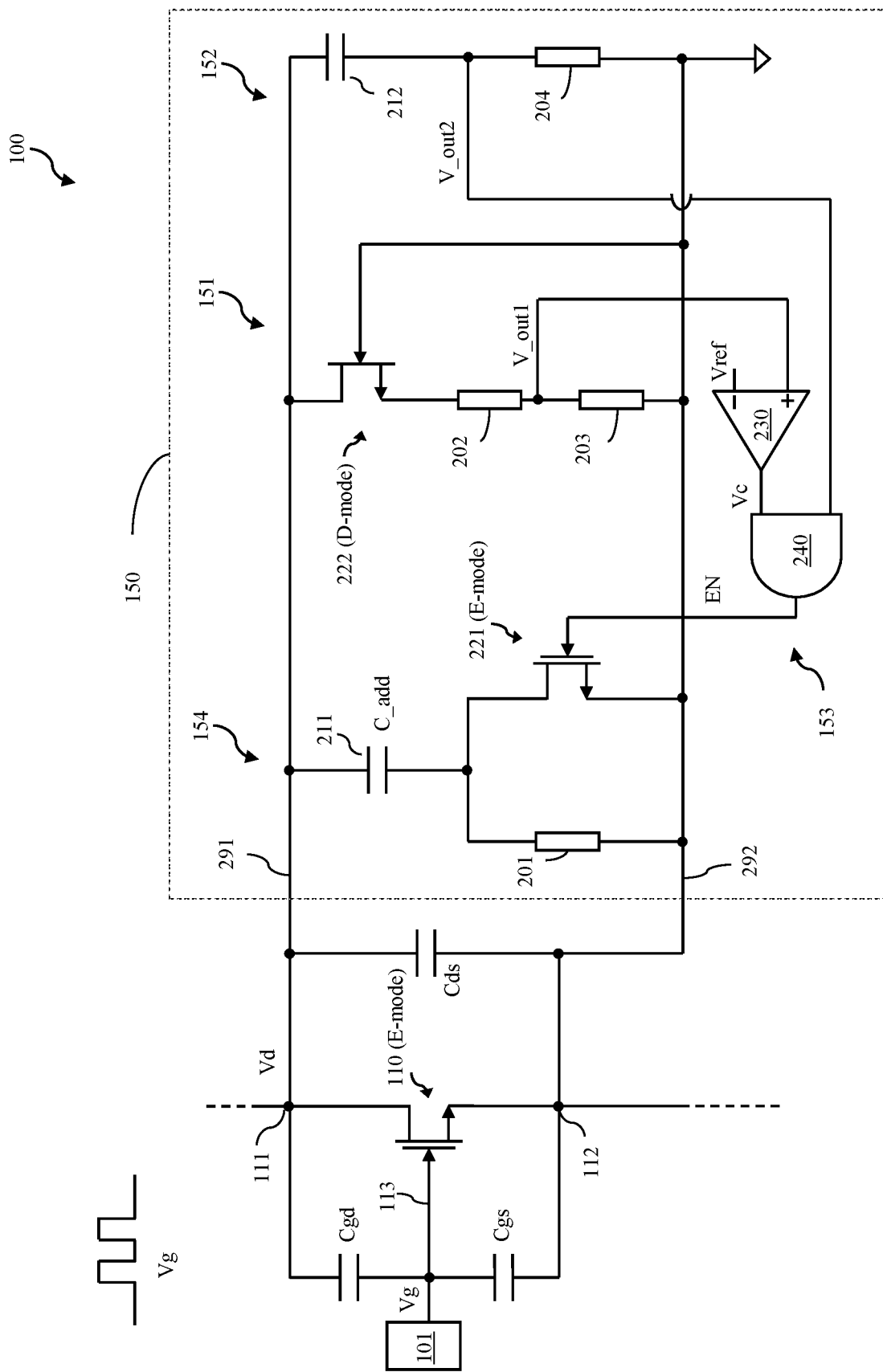
FIG. 2 is a circuit diagram illustrating, in greater detail, an example of the integrated turn-off slew rate controller.

FIG. 1 is a circuit diagram illustrating, generally, embodiments of a circuit structure 100 including an enhancement mode transistor 110 (hereinafter referred to as the transistor 110) and an integrated turn-off slew rate controller 150 (also referred to herein as controller 150) for the enhancement mode transistor 110. FIG. 2 is a circuit diagram illustrating the circuit structure 100 with an example of such a turn-off slew rate controller 150 illustrated in greater detail.

More particularly, referring to FIGS. 1 and 2, circuit structure 100 can include a transistor 110. Transistor 110 can include a source region 112 and a drain region 111. Transistor 110 can further include a channel region between the source region 112 and the drain region 111 and a gate 113 adjacent to the channel region. The transistor 110 can be configured as an enhancement mode transistor. For purposes of this disclosure, an enhancement mode transistor refers to a transistor, which is normally in an off state (i.e., a non-conductive state) and which requires application of a positive gate voltage to the gate thereof to switch the transistor to an on state (i.e., a conductive state). Such an enhancement mode transistor can be, for example, an enhancement mode N-channel, high voltage, III-V semiconductor transistor, such as an enhancement mode N-channel, high voltage, GaN-based HEMT or MISHEMT or some other type of enhancement mode N-channel, high voltage, III-V semiconductor-based HEMT or MISHEMT. Various enhancement mode transistor configurations are well known in the art and, thus, the details thereof have been omitted from this specification in order to allow the reader to focus on the salient aspects of the disclosed embodiments.

Gate 113 of transistor 110 can be connected to receive a gate voltage signal (Vg). For example, circuit structure 100 can further include an input/output pad 101 (also referred to herein as a pad or gate pad). The pad 101 can be electrically connected to gate 113 and can receive Vg. In some embodiments, Vg can be, for example, a pulse-width modulation (PWM) signal, which oscillates between a low voltage (e.g., 0V or some other suitable low voltage) and a high voltage (e.g., in the range of 5-7V or some other suitable high voltage). Additionally, the source region 112 can be electrically connected to ground. Thus, when Vg switches to the high voltage, transistor 110 transitions to an on state (i.e., a conductive state) and the drain voltage on drain region 111 is pulled down. The rate of change of the drain voltage (Vd) when the transistor 110 turns on is referred to herein as the turn-on slew rate (dV/dt_on) and it will be negative indicating the decrease in Vd over time. When Vg switches to the low voltage, transistor 110 transitions to the off state (i.e., a non-conductive state) and Vd on the drain region 111 begins to rise. The rate of change of the Vd when the transistor 110 turns off is referred to herein as the turn-off slew rate (dV/dt_off) and it will be positive indicating the increase in Vd over time. Switching of the transistor 110 between on and off states (including the corresponding change in the drain voltage) may be relatively fast. Fast switching and, particularly, fast switching to the off state in some devices (such as power supplies) can lead to ringing and higher order harmonics that can, in turn, lead to electromagnetic interference that requires expensive filtering components to mitigate. Therefore, as discussed in greater detail below, the circuit structure 100 also includes a turn-off slew rate controller 150 for the enhancement mode transistor 110.

The turn-off slew rate controller 150 (hereinafter referred to as controller 150) can be electrically connected to both the source region 112 and the drain region 111 of the transistor 110. Controller 150 can be configured to increase the drain-source capacitance (Cds) of the transistor 110 only when the transistor 110 is in the process of transitioning to the off state (e.g., as indicated by Vd being at or above a predetermined positive drain voltage level and further having a positive slew rate). Increasing Cds effectively slows the turn-off slew rate (dV/dt_off) because dV/dt_off=1/Cds (i.e., Cds is inversely proportional to dV/dt_off) to avoid ringing and higher order harmonics.

Specifically, controller 150 can include a pair of sensors (i.e., a first sensor 151 and a second sensor 152), each connected to drain region 111 of transistor 110. The first sensor 151 can be configured to sense the level of Vd on the drain region 111 and to output a first sensor voltage output (V_out1) indicative of whether Vd is at or above a predetermined positive voltage level. The second sensor 152 can be configured to sense the polarity of the slew rate and to output a second sensor voltage output (V_out2) indicative of whether the slew rate is negative or positive. Controller 150 can further include logic circuit 153. Logic circuit 153 can be connected to the first sensor 151 for receiving V_out1, connected to the second sensor 152 for receiving V_out2 and configured to generate and output an enable signal (EN), based on V_out1 and V_out2. For example, EN can have a first logic value (e.g., a logic 0 value) when V_out1 indicates that Vd is not at or above the predetermined positive voltage level and/or when V_out2 indicates that the slew rate is not positive (i.e., when the transistor 110 is not turning off). Additionally, EN can switch to a second logic value (e.g., a logic 1 value) when V_out1 indicates that Vd is at or above the predetermined positive voltage level and when V_out2 indicates that the slew rate is positive (i.e., when the transistor 110 is turning off). Controller 150 can further include a capacitance adder 154. The capacitance adder 154 can be electrically connected to the logic circuit 153 for receiving EN. The capacitance adder 154 can further be electrically connected to the source region 112 and drain region 111 of the transistor 110 and can be configured to selectively add capacitance (C_add) to Cds of the transistor 110. Specifically, the capacitance adder 154 can be controlled by the logic value of EN such that it only adds capacitance to Cds when EN has the second logic value (e.g., a logic value of 1).

One example of such a controller 150 that can be incorporated into the circuit structure 100 is illustrated in greater detail in FIG. 2.

In this example, controller 150 can include a first interconnect line 291 (i.e., a first electrical connection including one or more interconnects (e.g., wires, vias, local interconnects, etc.) electrically connected to the drain region 111 of transistor 110 and a second interconnect line 292 (i.e., a second electrical connection including one or more interconnects) electrically connected to the source region 112. The second interconnect line 292 can further be tied to ground.

Controller 150 can include a capacitance adder 154. The capacitance adder 154 can include a capacitor 211 and an additional enhancement mode transistor 221 electrically connected in series between the first interconnect line 291 and the second interconnect line 292. Specifically, the capacitor 211 can have a first plate electrically connected to the first interconnect line 291 (and thereby the drain region 111 of the transistor 110). The capacitor 211 can further have a second plate. The additional enhancement mode transistor 221 can have a drain region electrically connected to the second plate of the capacitor 211 and a source region electrically connected to the second interconnect line 292 (and thereby the source region 112 of the transistor 110 and also to ground). The gate of the additional enhancement mode transistor 221 can be connected to logic circuit 153 (as discussed in greater detail below) to receive an enable signal (EN). The additional enhancement mode transistor 221, like the transistor 110, can be, for example, an enhancement mode N-channel, high voltage, III-V semiconductor transistor, such as an enhancement mode N-channel, high voltage, GaN-based HEMT or MISHEMT or some other type of enhancement mode N-channel, high voltage, III-V semiconductor-based HEMT or MISHEMT. The capacitance adder 154 can further include a first resistor 201 also connected in series between the second plate of the capacitor 211 and the second interconnect line 292.

Controller 150 can further include a first sensor 151. The first sensor 151 can include, for example, a depletion mode transistor 222 and a voltage divider (discussed below) connected between the first interconnect line 291 and the second interconnect line 292. For purposes of this disclosure, a depletion mode transistor refers to a transistor, which is normally in an on state (i.e., a conductive state) even when gate-source voltage (Vgs) is at 0 volts. Such a depletion mode transistor can be, for example, a depletion mode N-channel, high voltage, III-V semiconductor transistor, such as a depletion mode N-channel, high voltage, GaN-based HEMT or MISHEMT or some other type of depletion mode N-channel, high voltage, III-V semiconductor-based HEMT or MISHEMT. Various depletion mode transistor configurations are well known in the art and, thus, the details thereof have been omitted from this specification in order to allow the reader to focus on the salient aspects of the disclosed embodiments. The gate of the depletion mode transistor 222 can also be electrically connected to the second interconnect line 292 and thereby to ground.

Additionally, the depletion mode transistor 222 of the first sensor 151 can be selected so as to have a specific pinch-off voltage (Vp). Those skilled in the art will recognize that Vp refers to the source-gate voltage (Vsg) where drain current (Id) reaches a constant saturation value (i.e., saturation drain current (Idss) set by the resistors connected to the source of the depletion mode device). In the disclosed embodiments, Vp can correspond to the predetermined positive drain voltage level required (along with a positive slew rate) to trigger capacitance adding to reduce the turn-off slew rate. Vp can, for example, be between 75V and 150V. In some embodiment Vp can be 100V. In operation, as Vd increases, the Vsg increases and reaches Vp so as to support Idss.

As mentioned above, the first sensor 151 can also include a voltage divider. The voltage divider can include a second resistor 202 connected to the source region of depletion mode transistor 222, a third resistor 203 connected between the second resistor 202 and the second interconnect line 292, and a first sensor output node at a junction between the two resistors 202-203. The voltage divider can be configured to reduce the source voltage (Vs) at the source region of the depletion mode transistor 222 to V_out1, which is at a level suitable for use in the logic circuit 153, described in greater detail below and which is indicative of whether or not Vd on the drain region 111 is at or above a predetermined positive voltage level. For example, a V_out1 that is less than a reference voltage (Vref) can indicate that Vd is not at or above the predetermined positive voltage level and V_out1 that is above Vref can indicate that Vd is at or above the predetermined positive voltage level.

Controller 150 can further include a second sensor 152. The second sensor 152 can include an additional capacitor 212 and a fourth resistor 204 connected in series between the first interconnect line 291 and the second interconnect line 292. The second sensor 152 can further include a second sensor output node, which outputs V_out2, at a junction between the additional capacitor 212 and the fourth resistor 204. Thus, the second sensor 152 operates as an RC high-pass filter. In this case, V_out2 at a high voltage level indicates a positive slew rate, otherwise V_out2 is at a low voltage level.

Controller 150 can further include logic circuit 153. Logic circuit 153 can include a comparator 230 (e.g., an operational amplifier comparator), which is electrically connected to receive, as inputs, V_out1 and Vref. The comparator 230 can further be configured to compare V_out1 to Vref and to output a comparator output voltage (Vc) based on the difference between the two. For example, V_out1 can be received at the non-inverting input (+) of the comparator 230 and Vref can be received at the inverting input (−). Thus, when Vd is not at or above the predetermined positive voltage level such that V_out1 is lower than Vref, Vc will be low (i.e., at a logic 0 value). However, when V_out1 is greater than Vref, Vc will be high (i.e., at a logic 1 value). The logic circuit 153 can further include a logic gate 240, which is connected to receive, as inputs, Vc from the comparator 230 and V_out2 from the second sensor 152 and which is configured to output EN depending upon the combination of logic values of Vc and V_out2. For example, logic gate 240 can be an AND gate, which operates according to a conventional AND gate truth table. In such an AND gate, EN will be high (i.e., at a logic 1 value) only when Vc is at the logic 1 value (i.e., indicating that Vd is at or above the predetermined positive voltage level) and V_out2 is also at the logic 1 value (i.e., indicating that slew rate is positive). EN will be low (i.e., at a logic 0 value) under all other conditions (i.e., when Vc and/or V_out2 are both low).

As mentioned above, within the capacitance adder 154, the gate of the additional enhancement mode transistor 221 can be connected to receive EN from the logic circuit 153. When EN is low (i.e., at a logic 0 value) because Vd is not at or above the predetermined positive voltage level and/or because it does not have a positive slew rate, the additional enhancement mode transistor 221 remains off (and capacitance adding is not enabled). However, when EN goes high (i.e., switches to a logic 1 value) because Vd is at or above the predetermined positive voltage level and the slew rate is positive (i.e., the transistor 110 is turning off), the additional enhancement mode transistor 221 is turned on (and capacitance adding is enabled). In operation, when the additional enhancement mode transistor 221 turns on, the first and second plates of the capacitor 211 are electrically connected to the drain region 111 and the source region 112, respectively, of the transistor 110 (via the first and second interconnect lines 291-292), thereby increasing Cds of the transistor 110 by C_add.

Figure 3A:
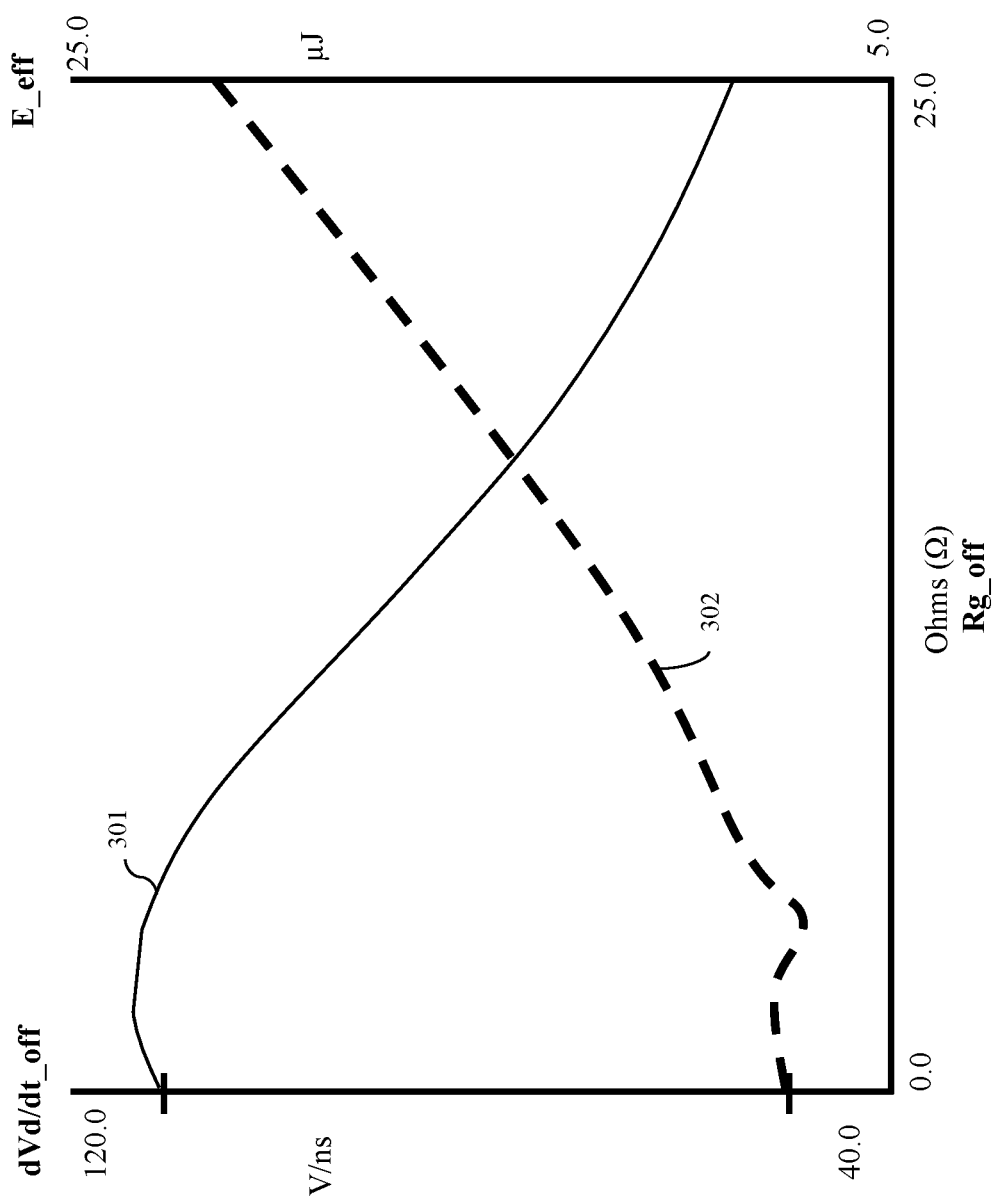
FIG. 3A is a graph directed to a conventional circuit structure with turn-off slew rate control and compares a relationship between turn-off slew rate and changes in turn-off gate resistance and a relationship between turn-off energy loss and turn-off gate resistance.
Figure 3B:
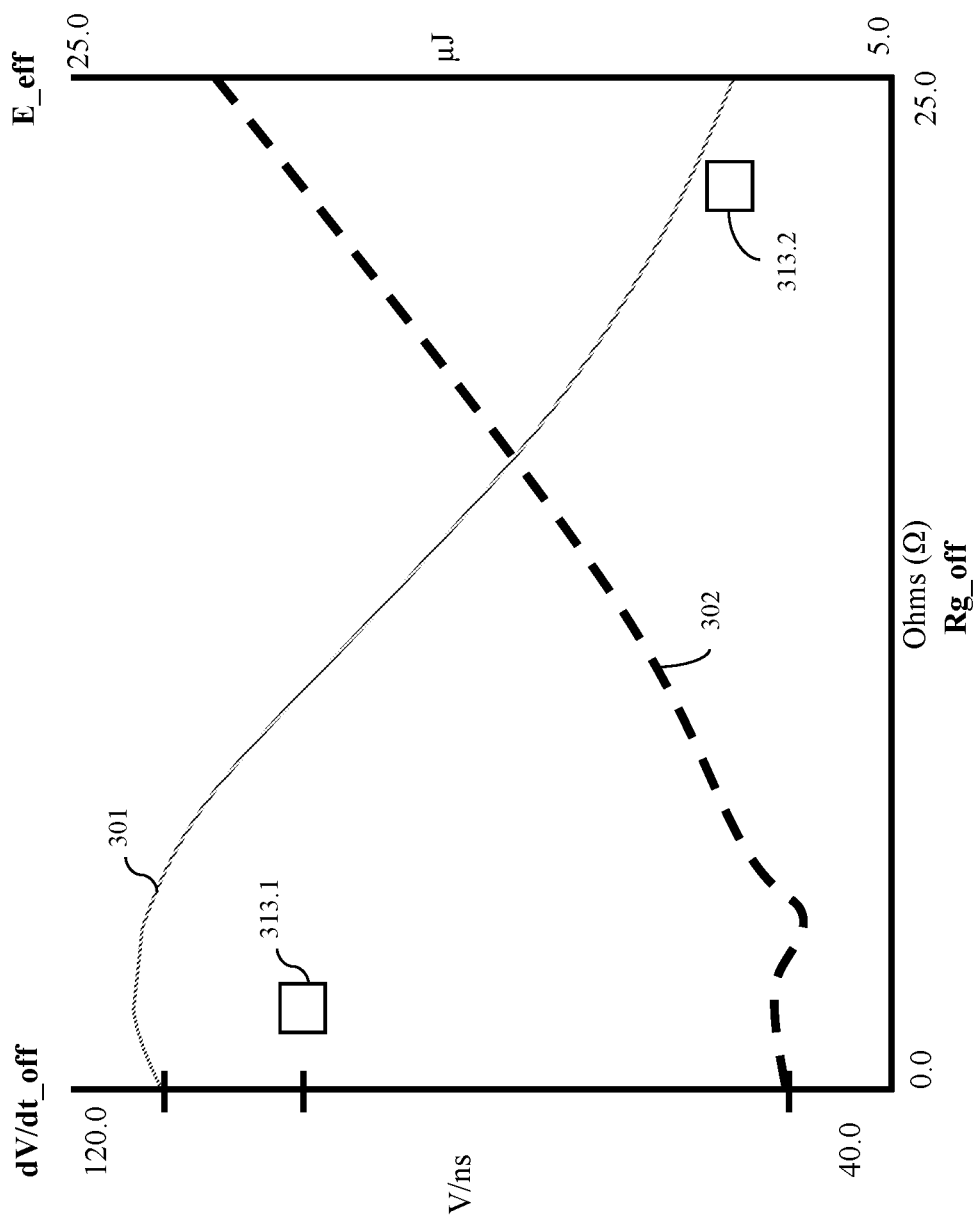
FIG. 3B is a graph directed to the disclosed circuit structure and compares a relationship between turn-off slew rate and changes in turn-off gate resistance and the relationship between turn-off energy loss and turn-off gate resistance.

As discussed above, increasing Cds of the transistor 110 in this manner slows dV/dt_off to avoid ringing and higher order harmonics. Furthermore, by increasing Cds (as opposed to simply increasing the turn-off gate resistance (Rg_off)), dV/dt_off is slowed without further increasing turn-off energy loss (E_off). FIG. 3A is a graph directed to a conventional circuit structure with turn-off slew rate control and compares a relationship between dV/dt_off (as measured in volts/nanoseconds) (e.g., in a range of 40.0-120.0 V/ns) and changes in Rg_off (as measured in Ohms (e.g., in a range of 0.0-25.0 Ohms)) and a relationship between E_off (as measured in microjoules (μJ)) (e.g., in a range of 5-25 μJ) and Rg_off. As illustrated, the curves 301 and 302 illustrate that as dV/dt_off to Rg_off decreases, E_off to Rg_off increases. FIG. 3B is a graph directed to the disclosed circuit structure and illustrates drops in the dV/dt_off (e.g., see items 313.1 and 313.2) when implementing embodiments of the turn-off slew rate controller 150 as compared to the relationship between dV/dt_off and changes in Rg_off illustrated in curve 301 and further illustrates that the relationship between E_off and Rg_off remains essentially the same. That is, the added drain-source capacitance (Cds) effectively slows dV/dt_off without also further increasing E_off.

It should be understood that in the circuit structure embodiments described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V semiconductor materials (also referred to as III-V compound semiconductors), which are compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a transistor having a source region and a drain region, wherein the transistor is an enhancement mode transistor; and
   a slew rate controller connected to the source region and to the drain region, wherein the slew rate controller increases drain-source capacitance of the transistor to slow a slew rate, when a drain voltage at the drain region rises at least to a predetermined positive drain voltage level and the slew rate is positive.

2. The structure of claim 1, wherein, by increasing the drain-source capacitance, the slew rate is slowed without increasing energy loss.

3. The structure of claim 1, wherein the slew rate is positive when the transistor transitions to an off state because a gate voltage signal has switched to a zero or negative voltage level and wherein the slew rate is negative when the transistor transitions to an on state because the gate voltage signal has switched to a positive voltage level.

4. The structure of claim 3, wherein the gate voltage signal is a pulse-width modulation signal.

5. The structure of claim 1,
wherein the slew rate controller includes a capacitance adder including: a capacitor and an additional enhancement mode transistor connected in series between the drain region and the source region, and
wherein the additional enhancement mode transistor is controlled by an internally generated enable signal that causes the additional enhancement mode to switch to an on state connecting plates of the capacitor to the drain region and the source region, respectively, and increasing the drain-source capacitance when the drain voltage rises at least to the predetermined positive drain voltage level and the slew rate is positive.

6. The structure of claim 1, wherein the transistor is a III-V semiconductor transistor.

7. The structure of claim 1, wherein the transistor is one of a gallium nitride-based high electron mobility transistor and a gallium nitride-based metal-insulator-semiconductor high electron mobility transistor.

8. A structure comprising:
a transistor having a source region and a drain region, wherein the transistor is an enhancement mode transistor; and
a slew rate controller connected to the source region and to the drain region, wherein the slew rate controller includes:
sensors connected to the drain region, wherein the sensors sense a drain voltage at the drain region and a slew rate, respectively;
a logic circuit connected to the sensors, wherein the logic circuit generates and outputs an enable signal that switches from a logic 0 value to a logic 1 value when the drain voltage is at least at a predetermined positive drain voltage level and the slew rate is positive; and
a capacitance adder connected to the logic circuit, the drain region, and the source region, wherein the capacitance adder increases drain-source capacitance of the transistor to slow the slew rate when the enable signal has the logic 1 value.

9. The structure of claim 8, wherein, by increasing the drain-source capacitance, the slew rate is slowed without increasing energy loss.

10. The structure of claim 8, wherein the slew rate is positive when the transistor transitions to an off state because a gate voltage signal has switched to a zero or negative voltage level and wherein the slew rate is negative when the transistor transitions to an on state because the gate voltage signal has switched to a positive voltage level.

11. The structure of claim 10, wherein the gate voltage signal is a pulse-width modulation signal.

12. The structure of claim 8,
wherein the capacitance adder includes: a capacitor and an additional enhancement mode transistor connected in series between the drain region and the source region,
wherein the enable signal with the logic 1 value causes the additional enhancement mode to switch to an on state connecting plates of the capacitor to the drain region and the source region, respectively, and increasing the drain-source capacitance.

13. The structure of claim 8, wherein the transistor is a III-V semiconductor transistor.

14. The structure of claim 8, wherein the transistor is one of a gallium nitride-based high electron mobility transistor and a gallium nitride-based metal-insulator-semiconductor high electron mobility transistor.

15. A structure comprising:
an enhancement mode transistor having a source region and a drain region; and
a slew rate controller including:
a first interconnect line connected to the drain region;
a second interconnect line connected to the source region and to ground;
sensors connected to the first interconnect line and to the second interconnect line, wherein the sensors sense a drain voltage at the drain region and a slew rate, respectively;
a logic circuit connected to the sensors, wherein the logic circuit generates and outputs an enable signal that switches from a logic 0 value to a logic 1 value when the drain voltage is at least at a predetermined positive drain voltage level and the slew rate is positive; and
a capacitance adder including: a capacitor and an additional enhancement mode transistor connected in series between the first interconnect line and the second interconnect line,
wherein the additional enhancement mode transistor has a gate connected to receive the enable signal, and
wherein the additional enhancement mode transistor turns on when the enable signal has the logic 1 value and electrically connects plates of the capacitor to the drain region and the source region, respectively, to increase drain-source capacitance of the enhancement mode transistor and slow the slew rate.

16. The structure of claim 15, wherein, by increasing the drain-source capacitance, the slew rate is slowed without increasing energy loss.

17. The structure of claim 15, wherein the slew rate is positive when the transistor transitions to an off state because a gate voltage signal has switched to a zero or negative voltage level, wherein the slew rate is negative when the transistor transitions to an on state because the gate voltage signal has switched to a positive voltage level, and wherein the gate voltage signal is a pulse-width modulation signal.

18. The structure of claim 15,
wherein the capacitance adder further includes a first resistor connected in series between the capacitor and the second interconnect line, and
wherein the sensors include:
a first sensor including: a depletion mode transistor and a voltage divider connected in series between the first interconnect line and the second interconnect line, wherein the voltage divider includes a second resistor and a third resistor connected in series between the depletion mode transistor and the second interconnect line and wherein a first sensor output voltage at a junction between the second resistor and the third resistor is indicative of the drain voltage; and
a second sensor including: an additional capacitor and a fourth resistor connected in series between the first interconnect line and the second interconnect line, wherein a second sensor output voltage at a junction between the additional capacitor and the fourth resistor is indicative of the slew rate.

19. The structure of claim 18, wherein the logic circuit includes:
- a comparator connected to receive the first sensor output voltage and a reference voltage, wherein the comparator outputs a comparator output voltage based on a difference between the first sensor output voltage and the reference voltage; and
- a logic gate connected to receive the comparator output voltage and the second sensor output voltage, wherein the logic gate generates and outputs the enable signal based on the comparator output voltage and the second sensor output voltage.

20. The structure of claim 19,
wherein the comparator has a non-inverting input that receives the first sensor output voltage, an inverting input that receives the reference voltage, and an output that outputs the comparator output voltage with the logic 1 value when the first sensor output voltage is above the reference voltage,
wherein the logic gate is an AND gate, and
wherein the enable signal output from the AND gate has the logic 1 value when the comparator output voltage has the logic 1 value, and the second sensor output voltage has the logic 1 value.

\* \* \* \* \*